United States Patent
Kretz

(10) Patent No.: US 9,470,717 B2
(45) Date of Patent: Oct. 18, 2016

(54) CABLE INTERFACE FOR COAXIAL CABLES

(71) Applicant: HUBER+SUHNER AG, Herisau (CH)

(72) Inventor: Adjan Kretz, St. Gallen (CH)

(73) Assignee: Huber+Suhner AG, Herisau (CH)

( * ) Notice: Subject to any disclaimer, the term of this patent is extended or adjusted under 35 U.S.C. 154(b) by 272 days.

(21) Appl. No.: 14/358,198

(22) PCT Filed: Oct. 23, 2012

(86) PCT No.: PCT/EP2012/070913
§ 371 (c)(1),
(2) Date: May 14, 2014

(87) PCT Pub. No.: WO2013/072160
PCT Pub. Date: May 23, 2013

(65) Prior Publication Data
US 2015/0130491 A1    May 14, 2015

(30) Foreign Application Priority Data
Nov. 14, 2011   (CH) ...................................... 1814/11

(51) Int. Cl.
| | |
|---|---|
| H01R 12/79 | (2011.01) |
| H01R 24/50 | (2011.01) |
| G01R 1/073 | (2006.01) |
| H01R 9/05 | (2006.01) |
| H01R 13/02 | (2006.01) |
| H01R 13/6599 | (2011.01) |
| G01R 3/00 | (2006.01) |

(52) U.S. Cl.
CPC ............. *G01R 1/07307* (2013.01); *G01R 3/00* (2013.01); *H01R 9/0515* (2013.01); *H01R 13/025* (2013.01); *H01R 13/6599* (2013.01); *H01R 2201/20* (2013.01); *Y10T 29/49224* (2015.01)

(58) Field of Classification Search
CPC .... H01R 12/79; H01R 24/50; H01R 13/035; H01R 23/722; H01R 2103/00; H01R 13/65805
See application file for complete search history.

(56) References Cited

U.S. PATENT DOCUMENTS

| | | | | |
|---|---|---|---|---|
| 4,012,099 A | * | 3/1977 | Worcester ............ | H01R 13/193 439/264 |
| 4,964,814 A | * | 10/1990 | Tengler ................ | H01R 23/688 439/581 |
| 5,046,966 A | | 9/1991 | Snyder et al. | |

(Continued)

FOREIGN PATENT DOCUMENTS

| WO | WO 2008/045296 A1 | 4/2008 |
|---|---|---|
| WO | WO 2009 105222 A2 | 8/2009 |

(Continued)

*Primary Examiner* — Gary Paumen
(74) *Attorney, Agent, or Firm* — Pauley Erickson & Kottis

(57) ABSTRACT

The invention relates to a cable interface (1) for operatively connecting a plurality of coaxial cables (11). A main body (2) has a first side face and an opposing second side face (3, 4) with a plurality of blind holes (5) arranged in a pattern in the first side face (3). An internal conductor opening (7) is formed at the bottom (6) of each blind hole (5) and arranged substantially coaxial with the blind hole (5), which is likewise coated with an electrically conductive material and is used for operatively connecting an internal conductor (17) of the coaxial cable (11). The blind holes (5) cooperate with at least one first bore (8), which extends from the second side face (4) into the main body (2) and is coated with an electrically conductive material.

12 Claims, 3 Drawing Sheets

(56) References Cited

U.S. PATENT DOCUMENTS

| | | | | |
|---|---|---|---|---|
| 5,399,104 A * | 3/1995 | Middlehurst | H01R 23/688 |
| | | | 29/846 |
| 5,525,075 A * | 6/1996 | Michisita | H01P 5/085 |
| | | | 439/581 |
| 5,743,765 A * | 4/1998 | Andrews | H01R 23/688 |
| | | | 439/607.1 |
| 6,053,744 A * | 4/2000 | Gray | H01R 24/50 |
| | | | 439/63 |
| 6,132,244 A * | 10/2000 | Leeman | H01R 23/688 |
| | | | 439/541.5 |
| 6,341,961 B1 * | 1/2002 | Juntwait | H01R 24/50 |
| | | | 439/579 |
| 6,420,888 B1 | 7/2002 | Griffin et al. | |
| 6,491,529 B2 * | 12/2002 | Gray | H01R 24/50 |
| | | | 439/79 |
| 6,491,545 B1 * | 12/2002 | Spiegel | H01R 13/514 |
| | | | 439/579 |
| 6,686,732 B2 | 2/2004 | Parrish | |
| 6,837,741 B2 * | 1/2005 | Kuwahara | H01R 4/023 |
| | | | 439/497 |
| 7,364,461 B1 | 4/2008 | Back et al. | |
| 7,815,466 B2 | 10/2010 | Yaghmai et al. | |
| 7,816,932 B2 | 10/2010 | Cartier, Jr. | |
| 8,535,623 B2 * | 9/2013 | Nakamura | G01D 15/00 |
| | | | 422/544 |
| 2003/0117129 A1 | 6/2003 | Parrish | |
| 2004/0061513 A1 | 4/2004 | Sweet et al. | |
| 2004/0185708 A1 | 9/2004 | Kuwahara | |
| 2005/0208828 A1 | 9/2005 | Miller et al. | |
| 2007/0184681 A1 | 8/2007 | Tutt et al. | |
| 2008/0293297 A1 * | 11/2008 | Wakamatsu | H01R 4/028 |
| | | | 439/581 |
| 2010/0142897 A1 | 6/2010 | Loveless | |
| 2010/0330838 A1 * | 12/2010 | Buff | H01R 13/6315 |
| | | | 439/581 |

FOREIGN PATENT DOCUMENTS

| | | |
|---|---|---|
| WO | WO 2009/151993 A2 | 12/2009 |
| WO | WO 2010/063588 A1 | 6/2010 |
| WO | WO 2010/117421 A1 | 10/2010 |

* cited by examiner

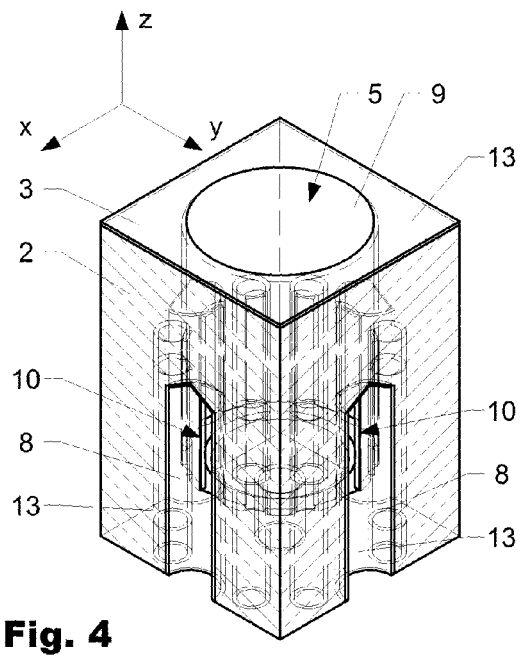
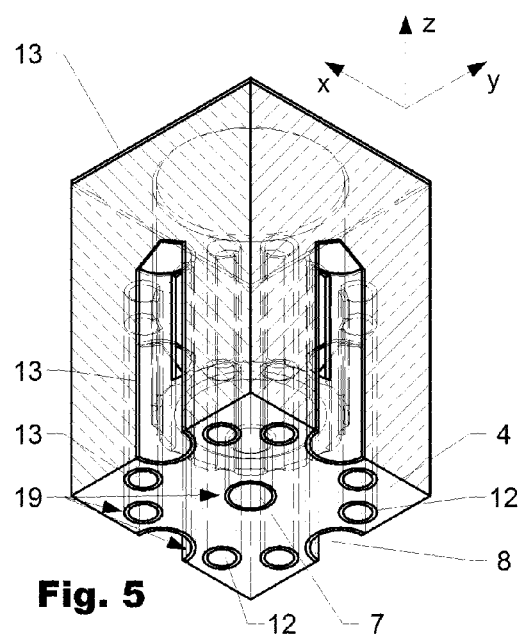
Fig. 4     Fig. 5
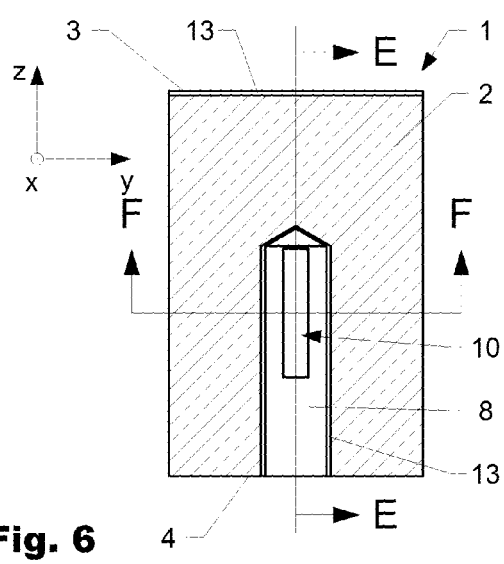
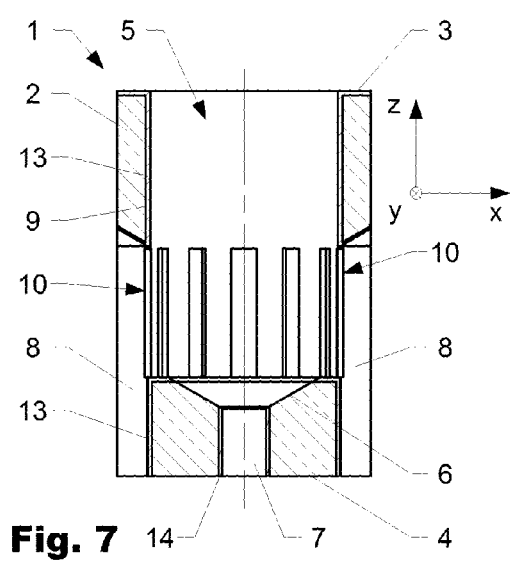
Fig. 6     Fig. 7
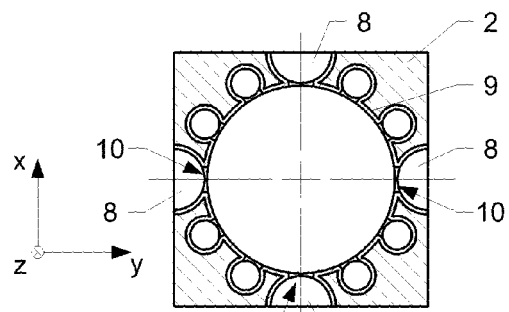
Fig. 8

CABLE INTERFACE FOR COAXIAL CABLES

BACKGROUND OF THE INVENTION

1. Field of the Invention

The invention is relevant to the field of connector- or interface technology for testing integrated circuits (IC), e.g. computer chips and microprocessors, and relates to a cable interface for a plurality of coaxial cables.

2. Discussion of Related Art

Processors used in commercially available computers have an ever increasing number of connections. Up to 1024 connections, which are used for transferring data and/or energy to and from a processor core, are expected in the future. The frequencies at which the data are transferred is in the gigahertz range. The functionality of every IC is checked and tested between the various production steps and at the final inspection. For this purpose, testing apparatus containing a load board are known from the prior art. In these load boards, a large number of serial connections are led from a test head to a measuring station. Currently, data rates of up to 6 Gbps are typically achieved. In the future, data rates of up to 15 Gbps or more are expected. Owing to the limited amount of space available on the load board and to the PCB (printed circuit board) connections, which are preferably as short as possible, 100 channels per square inch are advantageous.

Connectors or cable interfaces for testing chips that have a plurality of connections, which are inserted into load boards, are known from the prior art.

WO10063588 from the same applicant was published on Jun. 10, 2010 and concerns a three-dimensional test adapter (load board) for computer chips. The test adapter is suitable for a cable interface having a high connection density.

U.S. Pat. No. 7,364,461B from SV Probe PTE LTD was published on Apr. 29, 2008 and concerns what is known as a probe card assembly (PCA) which is used to test computer chips. The PCA has a main body having blind holes. Openings are provided at the end of the blind holes for receiving the inner conductors. Conductive elements, which are separate from said inner conductors, are arranged on the side of the blind holes. In order to be attached, the cables must be accessible from both below and above so that they can be soldered. As a result, high component densities are not possible.

U.S. Pat. No. 6,686,732B from Teradyne Inc. was published on Feb. 3, 2004 and concerns an inexpensive interface module. A so-called stiffener has a plurality of bores for receiving cables. The stiffener has a planar end face to which a substrate is bonded for signal transmission. The design of the connector is relatively complicated and said connector is not suitable for high component densities.

U.S. Pat. No. 7,816,932B from Teradyne Inc. was published for the first time in 2009 and concerns what is known as an interposer. The interposer has a housing which is made of a non-conductive material and a plurality of chambers which are arranged in a grid-like manner and in which conductive elements, e.g. made of wire, are arranged in one direction. The interposer is suitable for transferring high-frequency signals between a test device and a device being tested. For this purpose, the interposer is arranged between said two devices.

U.S. Pat. No. 7,815,466B from Teradyne Inc. was published in 2009 and relates to a cable interface for a plurality of coaxial cables. The cable interface has a base plate which is made of a non-conductive material and into which holes of different diameters are drilled. Non-continuous holes (blind holes) are used to receive stripped cables which are inserted into the plate from one side. The inner conductors of the cable are connected to the opposite side of the plate in an electrically conductive manner. For each blind hole, continuous holes are provided which extend at the side of said blind hole and parallel thereto, and which are each connected to one single blind hole.

Both the blind holes and the continuous holes are coated so as to be electrically conductive. The continuous holes are filled with tin solder or another material. Depending on the construction, each blind hole has continuous holes assigned thereto. The result of this is that the principle allows only a relatively low component density. In addition, this interface is difficult to produce as the arrangement of the conductive surfaces and regions is not optimal.

In conventional individual HF connectors, the soldering site around the cable and the connector is in principle freely accessible so attaching the cable to the connector is not a complex process. This can no longer be done in a simple manner in a cable interface with a high component density, since the cables are in very close proximity to one another.

SUMMARY OF THE INVENTION

An object of the invention consists in disclosing a cable interface for a plurality of coaxial cables which allows for a high component density, has a simple design and can be produced and assembled inexpensively.

This object is achieved by the cable interface defined in the claims, and by the method for the production and assembly thereof.

A cable interface according to the invention allows a pitch (spacing between two adjacent inner conductors) of approximately 2 mm or less. In a configuration of this type, the free space between the cables is extremely small. In one embodiment, the cable interface according to the invention has a main body produced from a non-conductive material (insulator). The main body comprises a first side face and an opposite second side face. A plurality of blind holes are provided in the first side face which are arranged in a grid and are provided to operatively connect one coaxial cable each. In order to be operatively connected to the blind hole, the coaxial cables are stripped in some regions and inserted into the blind holes. As described in greater detail below, they are then preferably soldered together. The blind holes have a first side wall which is coated with a conductive material. An inner-conductor opening arranged substantially coaxially with the blind hole is provided at the bottom of the blind holes. This opening is also coated with an electrically conductive material and serves to operatively connect an inner conductor of the coaxial cable. The side wall of the blind hole and the inner-conductor opening at the bottom of the blind hole are separated from one another by an insulator and are not interconnected in an electrically conductive manner.

The blind holes cooperate with at least one first bore which extends into the main body from the second side face. The first bore, or the wall thereof, is also coated with an electrically conductive material. The first bore is arranged, or formed, such that its conductive coating is at the same time operatively connected to the conductive coatings of two (adjacent) blind holes. This allows for a high component density and has a positive effect on the electrical behaviour or the field distribution. The at least one first bore is arranged such that it cuts into the outer face of at least one blind hole and forms a common through-opening therewith. In this context, "cutting into" is understood to mean that the cross section of the blind hole and the cross section of the bore, which is offset laterally with respect to the blind hole but arranged axially parallel thereto, overlap slightly and thus have two crossing points when viewed in cross section.

The first bore serves as a flow channel through which solder (e.g. of a solder bath) can rise when the cable is operatively connected. Distributing solder via flow channels is known from PCB (printed circuit board) manufacturing (what are known as vias). In order for the solder to flow reliably, the diameter must not fall below a particular size. Since the wavelength of the electrical signals in the present field of application are a similar size to the geometric structures, the spacing between the first bores is too great to bring about sufficient shielding. For this reason, one or more second bores can be arranged between the first bores. These second bores are primarily used to improve shielding. In a preferred embodiment, these also serve as flow channels and are filled with solder. The arrangement and orientation of the first and second bores can also have an effect on the characteristic impedance.

In a preferred embodiment, the first bores terminate in the region of the outer face of the first blind holes. This produces a cylindrical face between the first side face and the end of the first bores, which cylindrical face has a positive effect on stability and serves as a support face for the lateral support and precise guidance of the cables. According to the field of application, the first bores can also penetrate the main body and connect the second side face to the first side face. However, in this case the cables are no longer guided as precisely. At least one second bore, which cuts into just one outer face of a blind hole, can be arranged between two first bores. The second bore can penetrate the main body or terminate in the region of the side wall of an assigned blind hole. The first blind holes and/or the bores are generally perpendicular to the first side face. The first side face is coated, at least in some regions, with a conductive material which is operatively connected to the conductive coating of the side walls of the blind holes. This coating is arranged on the cable side and is used to keep all the side walls at the same electrical potential, which side walls are operatively connected to the outer conductors of the coaxial cables. The second side face can be mechanically machined (e.g. by grinding) without the electrically conductive coating being damaged by the coating being arranged on the side of the first side face and interconnecting the outer conductors. A further advantage consists in that less solder adheres to the second side face when the coaxial cables are operatively connected in comparison with the prior art.

The first and/or second bores can also have non-circular cross sections as required. In particular if the main body is produced by injection moulding, the cross sections can be e.g. rectangular. The cross section can also vary over the length, e.g. it can be pyramid-shaped or frustoconical.

The conductive coating of the blind hole is operatively connected to the conductive coating of the second side face via the conductive coating of the bores, which extend from the second side face to the outer wall of the assigned blind holes. The main body of the cable interface advantageously consists of plastics material or another material that has a low heat storage capacity and thus requires little energy in order to be heated up. This can be advantageous in particular when connecting the coaxial cables to the cable interface, since the main body can be rapidly brought to temperature. The main body can be produced e.g. by injection moulding.

In order to operatively connect coaxial cables using the above-described cable interface according to the invention, each coaxial cable is stripped over a defined length in the region of the inner and outer conductor. The stripped length is tailored to the depth of the blind hole and the depth of the inner-conductor opening at the bottom of the blind hole. The cables are then inserted next to one another into the blind holes from the first side face (cable side). Once all the cables to be connected are in position, the second side face is brought into connection with a solder bath. The capillary effect causes solder to rise into the first and/or second bores as far as into the cable-side blind holes, where the outer conductors of the coaxial cables are operatively connected, by the solder, to the side walls of the blind holes, which side walls are coated so as to be electrically conductive. A vacuum can be applied as required on the cable side in order to influence the rising of the solder. At the same time, solder rises into the inner-conductor openings at the bottom of the blind holes and connects the outer conductors to the side walls of said openings, which side walls have been coated so as to be electrically conductive.

BRIEF DESCRIPTION OF THE DRAWINGS

The invention will now be described in greater detail with reference to the embodiments shown in the following figures, in which:

FIG. 4 is an oblique perspective view from above of a blind hole;

FIG. 5 is an oblique perspective view from below of the blind hole according to FIG. 4;

FIG. 6 is a side view of the blind hole according to FIG. 4;

FIG. 7 is a sectional view of the blind hole according to FIG. 4 along the sectional line EE according to FIG. 6;

FIG. 8 is a sectional view of the blind hole according to FIG. 4 along the sectional line FF according to FIG. 6;

DETAILED DESCRIPTION OF THE INVENTION

Figure 1:
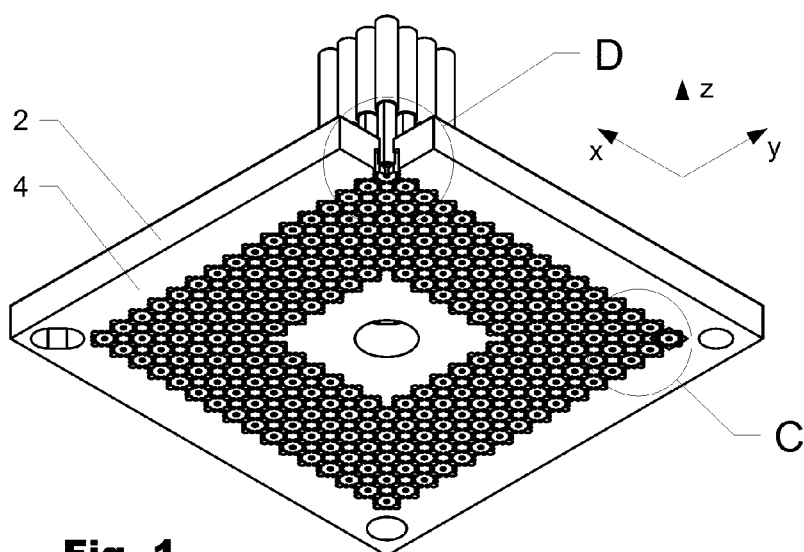
FIG. 1 is an oblique perspective view from below of a first embodiment of a cable interface.
Figure 2:
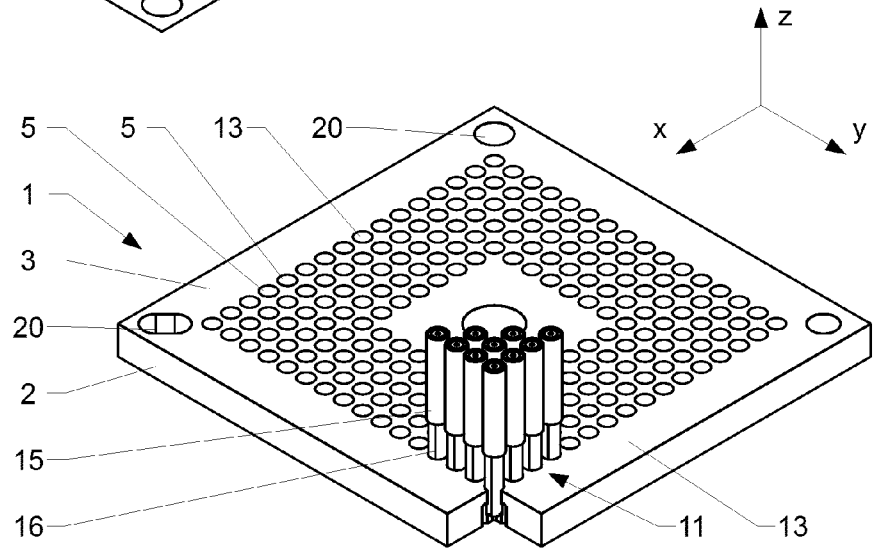
FIG. 2 is an oblique perspective view from above of the cable interface according to FIG. 1.
Figure 3:
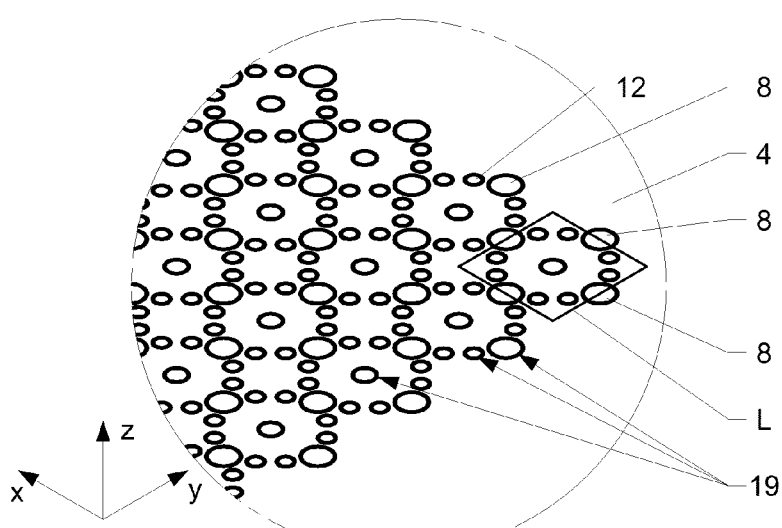
FIG. 3 is an enlarged view of detail D according to FIG. 1.
Figure 9:
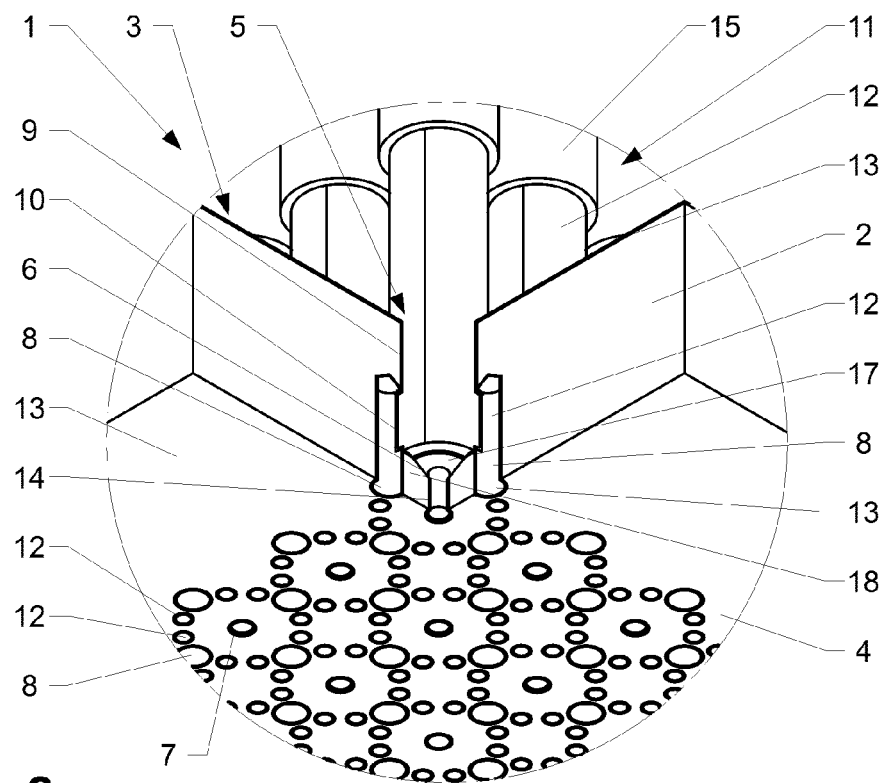
FIG. 9 shows detail D according to FIG. 1.

FIG. 1 is an oblique perspective view from below of a cable interface 1 according to the invention. FIG. 2 is an oblique perspective view from above of the same cable interface 1. FIG. 3 is an enlarged view of detail C according to FIG. 1. The cable interface 1 has a main body 2 (in this case a plate-shaped main body) having a cable-side first side face 3 and an interface-side second side face 4. The side faces 3, 4 are arranged parallel to one another. On the cable side, blind holes 5 arranged in a grid are set into the main body 2 perpendicular to the side face 3. FIG. 4 is an oblique perspective view from above (on the cable side) of a cut-out blind hole 5. FIG. 5 is an oblique view from below of the same blind hole 5. The sectional line is shown schematically in FIG. 3 by means of a line L. FIG. 6 is a side view of the cut-out blind hole 2. FIG. 7 is a sectional view through the blind hole 2 along a sectional line EE according to FIG. 6. FIG. 8 is a sectional view through the blind hole 2 along a sectional line FF according to FIG. 6. FIG. 9 shows detail D according to FIG. 1.

As can be seen in FIG. 7, the blind hole 5 has at its lower end (bottom 6) a continuous inner-conductor opening 7 which is arranged coaxially with the blind hole 5 and penetrates the second side face 4. In the embodiment shown, four first bores 8 can be seen (shown in section in FIGS. 4 to 8) around the periphery of the blind hole 5. The first bores 8 extend from the interface side into the main body 2 and are arranged such that they cut into the side walls 9 of two adjacent blind holes 5 and that they each form a through-opening 10 therewith. In the embodiment shown, the first bores, when viewed in the axial direction (z-axis), extend substantially into the centre of the axial length of the side wall 9 of the blind hole 5. The region of the side wall 9, which is between the end of the first bores 8 and the first side face 3, is used as a support face for operatively connected coaxial cables 11 (cf. FIG. 1), which are introduced into the blind holes 5 and are operatively connected to the cable interface 1 as described below. According to the field of application, the first bores 8 can also completely penetrate the main body 2 (this is not shown in greater detail). In each case, two second bores 12 are distributed over the circumference of the blind holes 5 between the first bores 8 and extend from the interface side into the main body 2, each likewise only cutting into one side wall 9 of a blind hole. The first and second bores 8, 12 are parallel to one another.

Both the side walls 9 of the blind holes 5 and the walls of the first and second bores 8, 12 are provided with a first electrically conductive coating 13, which also extends over the cable-side first side face 3 and through the through-openings 10. The coating keeps all the side walls 9 and the first side face 3 at the same electrical potential. The inner-conductor openings 7 are provided with a second electrically conductive coating 14 which is operatively connected to the first coating 13 in a non-electrically conductive manner.

The cable interface shown can be produced as follows: Firstly, a main body 2 is provided which has the desired number and arrangement of the blind holes 5 and the first and, if required, second bores 8, 12. The main body 2 advantageously consists of a electrically non-conductive material. Alternatively, the surface of the main body can be treated so that the main body is not electrically conductive. The main body 2 is then provided with an electrically conductive coating which at first may extend over the entire surface. The electrically conductive coating is removed from the interface-side second side face e.g. by grinding or another suitable machining method. In a further machining step, the electrically conductive coating is likewise removed from the bottoms 6 of the blind holes by mechanical machining, e.g. by means of a drill or a milling cutter. What are left behind are the first and second coatings 13, 14 which are no longer interconnected.

Typically, the process for operatively connecting coaxial cables is as follows: A defined length of an outer sheathing 15 is removed from the coaxial cables 11. A defined length of an outer conductor 16 and an insulator (not shown in greater detail) is then removed from the inner conductor (not shown in greater detail). Next, the coaxial cable 11 is introduced into its assigned blind hole 5 so that an inner conductor comes to rest in the corresponding inner-conductor opening 7 and the outer conductor 16 is arranged along the side wall 9 of the blind hole 5. Once the coaxial cables 11 to be connected are arranged, the main body 2 is dipped into a solder bath on the interface side so that solder rises in the first and second bores 8, 12 until the outer conductors 16 are operatively connected to the side walls 9 and the inner conductors are operatively connected to the side walls of the inner-conductor openings 7. If necessary, excess solder is then removed again e.g. by mechanical machining and/or chemical treatment.

On the interface side, the cable interface 1 has inner-conductor openings 7 which are arranged in a grid and are enclosed in a collar-like manner by first and, if provided, second bores 8, 12. The first and second bores can be operatively interconnected on the interface side by an electrically conductive coating as required.

As can be seen in FIGS. 1 and 2, the main body 2 is plate-shaped. At four corners, attachment openings 20 (only three shown) are provided, by means of which the cable interface 1 can be attached.

The regions, arranged in the second side face 4, of the first and second electrically conductive coating are used as a contact region 19 for directly or indirectly operatively connecting the cable interface 1 to a device (e.g. a chip) or an additional connector.

The cable interface can be connected on the interface side in various ways. For example, the contact regions 19 (the ends of the first and second bores in the region of the second side face) can be directly or indirectly connected to a chip. A film, which is only conductive in one direction, a conductive polymer, or the combination of a metallised plastics material and a chip socket can be used for example. The ends of the cables can also be directly contacted as required. The interposers from Teradyne Inc., described at the outset, are also suitable for example. An epoxy resin filled with silver powder, developed by the applicant, has proved advantageous as a conductive polymer. This can be applied for example in the paste printing process. In the process, the contact regions 19 are provided with for example pyramid-shaped or hemispherical contact elements (not shown in greater detail) which project beyond the side face 4.

Figure 10:
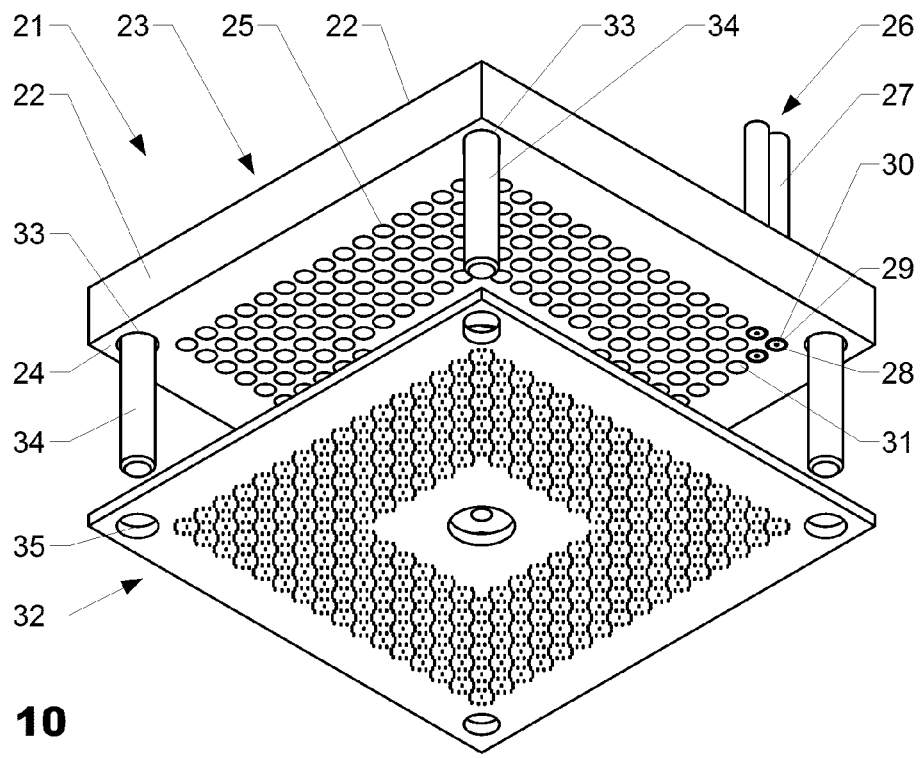
FIG. 10 shows another embodiment of a cable interface.

FIG. 10 is an oblique perspective view from below of another embodiment of a cable interface 21. The cable interface 21 has a main body 22 having a cable-side first side face 23 and an interface-side second side face 24. The main body 22 advantageously consists of a non-conductive material (insulator). The main body 22 can for example consist of plastics material and be produced by injection moulding. Holes 25 arranged in a grid-like manner are made in the base body 22 which extend from the first side face 23 to the second side face 24 and are intended for receiving coaxial cables 26. The main body advantageously has, at least along the cable-side side face 23, an electrically conductive coating which extends into the holes 25. For assembly purposes, the coaxial cables 26 are cut off perpendicular to their longitudinal axis. A defined length of a cable outer sheathing 27 is then removed. Next, the coaxial cables 26 are inserted into the holes 25 so that an outer conductor 28 of the coaxial cable 26 abuts a side wall 31 of the assigned hole 25 that has been coated so as to be electrically conductive. The inner conductor 29 and the insulator 30 may in this step still protrude slightly, but they are then ground down to a uniform length. Once the coaxial cables are in position, the main body is dipped into a solder bath on the interface side so that solder can rise up between the outer conductor 28 and the side wall 31 that has been coated so as to be electrically conductive, and the coaxial cables 26 are operatively connected to the main body or the side wall that has been coated so as to be electrically conductive. In the next step, the second side face 24 and the coaxial cables 25 are ground to be planar and superfluous solder is removed therefrom. The cable interface 21 according to FIG. 10 is also suitable for very high pitch densities. Unlike the cable interface 1 according to FIG. 1 to 9, the inner conductors 29 in this case are naked and are directly contacted. In the embodiment shown, an intermediate element (interposer) 32 is schematically shown which is used to operatively connect the cable interface 21 or the coaxial cables 26 to a chip to be tested or to another device (neither shown in greater detail). The main body 21 has attachment openings 33 which are arranged at the periphery and in which centring pins 34 are arranged. The interposer 32 has correspondingly formed centring openings 35 and is pushed upwards onto the centring pins 34 by said centring openings.

The invention claimed is:

1. A cable interface (1) for operatively connecting a plurality of coaxial cables (11), comprising:
   a. a main body (2) made of a non-conductive material and having a first side face (3) and an opposite second side face (4), wherein the first side face (3) has a plurality of blind holes (5) which are arranged in a grid and are provided for operatively connecting one coaxial cable (11) each,
   b. wherein the blind holes (5) each include one first side wall (9) that is coated with a conductive material,
   c. wherein the blind holes (5) each include, at the bottom (6) thereof, an inner-conductor opening (7) arranged substantially coaxially with the blind hole (5), and coated with an electrically conductive material and used for operatively connecting an inner conductor (17) of the coaxial cable (11),
   d. wherein the blind holes (5) each cooperate with at least one first bore (8) which extends into the main body (2) from the second side face (4), are coated with an electrically conductive material, and are arranged such that the conductive coating (13) of the at least one first bore (8) is at the same time operatively connected to the conductive coatings of two blind holes (5); and
   e. wherein the at least one bore (8) cuts into a side wall (9) of at least one blind hole (5) and forms a common through-opening (10) therewith.

2. The cable interface (1) according to claim 1 wherein the first bores (8) terminate in the region of the side walls (9) of the blind holes (5).

3. The cable interface (1) according to claim 1 wherein the first bores (8) penetrate the main body (2) and connect the second side face (4) to the first side face (3).

4. The cable interface (1) according to claim 1 wherein at least one second bore (12) is arranged between two first bores (8) and cuts into an outer face (9) of a blind hole (5).

5. The cable interface (1) according to claim 4, wherein the second bore (12) terminates in a region of the side wall (9) of the blind hole (5).

6. The cable interface (1) according to claim 4 wherein the second bore (12) is continuous and connects the first side face (3) to the second side face (4).

7. The cable interface (1) according to claim 1 wherein the blind holes (5) and/or the bores (8, 12) are arranged perpendicular to the first side face (3).

8. The cable interface (1) according to claim 1 wherein the first side face (3) is coated, at least in some regions, with a conductive material (13) which is operatively connected to the conductive coating of the blind holes (9).

9. The cable interface (1) according to claim 1 wherein the main body (2) comprises a plastics material.

10. The cable interface (1) according to claim 9, wherein the main body (2) is produced by injection moulding.

11. A method for producing a cable interface (1) according to claim 1 comprising the following method steps:
   a. providing a main body (2) comprising a first and second side face (3, 4);
   b. making a plurality of blind holes (5), arranged in a grid-like manner, in the first side face (3);
   c. making inner-conductor openings (7) in the bottom (6) of each blind hole (5);
   d. making first bores (8) in a second side face (4), the first bores (8) being arranged such that they at the same time cut into the side walls (9) of two adjacent blind holes (5);
   e. coating the main body (2) with an electrically conductive coating;
   f. removing the electrically conductive coating on the bottom (6) of each blind hole (5) so that the coating of the side wall (9) of the blind hole (5) is separated from the coating of the inner-conductor opening (7);
   g. removing, at least in some regions, the electrically conductive coating of the second side face.

12. A cable interface (1) for operatively connecting a plurality of coaxial cables (11), comprising:
   a. a main body (2) made of a non-conductive material and having a first side face (3) and an opposite second side face (4), wherein the first side face (3) has a plurality of blind holes (5) which are arranged in a grid and are provided for operatively connecting one coaxial cable (11) each,
   b. wherein the blind holes (5) each include one first side wall (9) that is coated with a conductive material,
   c. wherein the blind holes (5) each include, at the bottom (6) thereof, an inner-conductor opening (7) arranged substantially coaxially with the blind hole (5), and coated with an electrically conductive material and used for operatively connecting an inner conductor (17) of the coaxial cable (11),
   d. wherein the blind holes each cooperate with at least one first bore (8) which extends into the main body (2) from the second side face (4), are coated with an electrically conductive material, and are arranged such that the conductive coating (13) of the at least one first bore (8) is at the same time operatively connected to the conductive coatings of two blind holes (5); and
   e. wherein at least one second bore (12) is arranged between two first bores (8) and cuts into an outer face (9) of a blind hole (5).

* * * * *